United States Patent
Go

(10) Patent No.: US 7,504,978 B2
(45) Date of Patent: Mar. 17, 2009

(54) DIGITAL-ANALOG CONVERTER CAPABLE OF EASILY EXTENDING RESOLUTION

(75) Inventor: Chae Dong Go, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 0 days.

(21) Appl. No.: 11/939,190

(22) Filed: Nov. 13, 2007

(65) Prior Publication Data
US 2008/0129566 A1    Jun. 5, 2008

(30) Foreign Application Priority Data
Nov. 13, 2006    (KR)    ............. 10-2006-0111825

(51) Int. Cl.
*H03M 1/66*    (2006.01)
(52) U.S. Cl. ................ 341/144; 341/131
(58) Field of Classification Search .......... 341/144, 341/154, 141, 131, 135, 139
See application file for complete search history.

(56) References Cited

U.S. PATENT DOCUMENTS

| | | | |
|---|---|---|---|
| 7,015,847 B1 * | 3/2006 | McLachlan et al. | 341/145 |
| 7,265,611 B2 * | 9/2007 | Wang | 330/9 |
| 7,408,490 B2 * | 8/2008 | Melanson et al. | 341/120 |
| 2005/0122303 A1 | 6/2005 | Hashimoto | |
| 2006/0038764 A1 | 2/2006 | Takahashi et al. | |

* cited by examiner

*Primary Examiner*—Peguy JeanPierre
(74) *Attorney, Agent, or Firm*—Lowe Hauptman Ham & Berner

(57) ABSTRACT

There is provided a digital-analog converter capable of easily extending the resolution that can easily extend the resolution by a simple circuit implementation when a 10-bit digital-analog converter is configured on the basis of an 8-bit digital-analog converter used in a display driving IC, and prevent an increase in area of the display driving IC. A digital-analog converter capable of easily extending the resolution according to an aspect of the invention includes a voltage dividing unit including a plurality of resistors connected in series with each other between operating voltage terminals to divide operating voltages into a plurality of voltages at connection nodes of the plurality of resistors, a decoder unit providing a plurality of switching signals including a first switching signal for selecting a voltage and a second switching signal for controlling the current, a switch unit selecting two voltages from the plurality of voltages divided by the voltage dividing unit according to the first switching signal, a comparing unit comparing the two voltages with each other selected by the switching unit to output a reference current corresponding to a difference between the two voltages, a current control unit controlling a feedback current according to the second switching signal of the decoder unit, and an adding unit transmitting the feedback current to the current control unit and adding one voltage between the two voltages selected by the switch unit and a feedback voltage determined according to the feedback current.

10 Claims, 7 Drawing Sheets

DIGITAL-ANALOG CONVERTER CAPABLE OF EASILY EXTENDING RESOLUTION

CROSS-REFERENCE TO RELATED APPLICATIONS

This application claims the priority of Korean Patent Application No. 2006-111825 filed on Nov. 13, 2006, in the Korean Intellectual Property Office, the disclosure of which is incorporated herein by reference.

BACKGROUND OF THE INVENTION

1. Field of the Invention

The present invention relates to a digital-analog converter capable of easily extending the resolution, and more particularly, to a digital-analog converter capable of easily extending the resolution that can easily extend the resolution by a simple circuit implementation when a 10-bit digital-analog converter is configured on the basis of an 8-bit digital-analog converter used in a display driving IC, and prevent an increase in area of the display driving IC.

2. Description of the Related Art

In recent years, the market for display devices, especially, digital TVs has grown. In order to achieve high display quality, high output resolution of driving ICs of the display devices has been required.

In general, bit extension of the digital-analog converter used in the driving IC is performed to increase the output resolution of the driving IC.

FIG. 1A is a configuration view illustrating an example of a digital-analog converter according to the related art.

Referring to FIG. 1A, a digital-analog converter 10 according to the related art includes a first resistor array 11 that divides voltages by a plurality of resistors, a first switch array 12 that has a plurality of switches for selecting the divided voltages, a first buffer unit 13 that buffers the two voltages selected by the first switch array 12, a second resistor array 14 that divides the voltages buffered by the first buffer unit 13 by a plurality of resistors, a second switch array 15 that selects the voltages divided by the second resistor array 14, a decoder unit 16 that controls the operation of selecting the voltages by each of the first switch array 12 and the second switch array 15, and a second buffer unit 17 that buffers the voltages selected by the second switch array 15 to output a final output voltage.

The above-described digital-analog converter 10 according to the related art is obtained by adding the first buffer unit 13, the second resistor array 14, and the second switch array 15 to a converter with 8-bit resolution. However, problems occur with the bit extension in that an increase in the number of resistors and switches results in an increase of chip area, and an off-set voltage of the buffer unit is applied to the final output voltage to cause deterioration in off-set characteristics of the entire system.

FIG. 1B is a configuration view illustrating another example of a digital-analog converter according to the related art.

Referring to FIG. 1B, a digital-analog converter 20 according to the related art includes a first resistor array 21 that divides voltages by a plurality of resistors, a first switch array 22 that selects the voltages divided by the first resistor array 21 by a plurality of switches, a second resistor array 23 that divides the voltages divided by a plurality of resistors, a second switch array 24 that selects the voltages divided by the second resistor array 23 by a plurality of switches, a decoder unit 25 that controls the operation of selecting the voltages by the first switch array 22 and the second switch array 24, and a buffer unit 26 that buffers the voltages selected by the second switch array 24.

When compared with the digital-analog converter 10 according to the related art, which is shown in FIG. 1A, the digital-analog converter 20 according to the related art increases a plurality of resistances of the plurality of resistors that are included in the second resistor array 23 to thereby remove the first buffer unit 13. However, the second resistor array 23 and the second switch array 24 are added to extend the resolution of the digital-analog converter with 8-bit resolution. The addition of the second resistor array 23 and the second switch array 24 results in an increase in the number of resistors and switches. This increase results in an increase of chip area. Further, since the resistances of the resistors included in the second resistor array 23 are increased, a current loss may occur to reduce uniformity between output channels.

SUMMARY OF THE INVENTION

An aspect of the present invention provides a digital-analog converter that can easily perform bit extension by a simple circuit implementation when a converter having 10 bits or more is configured on the basis of an 8-bit digital-analog converter, and prevent an increase in area of the driving IC.

According to an aspect of the present invention, there is provided a digital-analog converter capable of easily extending the resolution, the digital-analog converter including a voltage dividing unit including a plurality of resistors connected in series with each other between operating voltage terminals to divide operating voltages into a plurality of voltages at connection nodes of the plurality of resistors, a decoder unit providing a plurality of switching signals including a first switching signal for selecting a voltage and a second switching signal for controlling the current, a switch unit selecting two voltages from the plurality of voltages divided by the voltage dividing unit according to the first switching signal, a comparing unit comparing the two voltages with each other selected by the switching unit to output a reference current corresponding to a difference between the two voltages, a current control unit controlling a feedback current according to the second switching signal of the decoder unit, and an adding unit transmitting the feedback current to the current control unit and adding one voltage between the two voltages selected by the switch unit and a feedback voltage determined according to the feedback current.

The switch unit may select two voltages of the connection nodes adjacent to each other from the plurality of voltages divided by the voltage dividing unit.

The decoder unit may include a first decoder decoding an external voltage selecting signal to provide the first switching signal, and a second decoder decoding an external current control signal to provide the second switching signal.

The comparing unit may include a first comparator circuit receiving a first voltage having a higher voltage than the other voltage between the two voltages, and a second voltage having a lower value than the first voltage to output the reference current corresponding to the difference between the first voltage and the second voltage according to a resistance set beforehand, and a second comparator circuit receiving the first voltage to off-set unnecessary current components occurring in the first comparator circuit according to a resistance set beforehand.

The first comparator circuit may include a first transistor group including a plurality of transistors each receiving and switching the first voltage and the second voltage from the comparing unit, a second transistor group including a plurality of transistors connected in series with the first transistor group and connected in parallel with each other to mirror the current switched by the first transistor group, a first resistor having a resistance set beforehand and connected between input terminals of the plurality of transistors of the first transistor group, a third transistor group including a plurality of transistors connected to both ends of the first resistor, respectively, to mirror the current switched by the first transistor group, and a fourth transistor group including a plurality of transistors receiving the switched current mirrored by the third transistor group, the transistors connected in parallel with each other and mirroring the current mirrored by the third transistor group to generate the reference current, and the second comparator circuit may include a fifth transistor group including a plurality of transistors each receiving and switching the first voltage from the comparing unit, a sixth transistor group including a plurality of transistors connected in series with the fifth transistor group, connected in parallel with each other, and mirroring the current switched by the fifth transistor group, a second resistor having a resistance value set beforehand and connected between input terminals of the plurality of transistors of the fifth transistor group, a seventh transistor group including a plurality of transistors connected to both ends of the second resistor, respectively, to mirror the switched current mirrored by the fifth transistor group, and an eight transistor group including a plurality of transistors receiving the switched current mirrored by the seventh transistor group, the transistors connected in parallel with each other and mirroring the current mirrored by the seventh transistor group to off-set necessary current components included in the reference current of the fourth transistor group.

The current control unit may switch parallel paths of the feedback current according to the second switching signal, and mirrors a feedback current of the selected path using the reference current from the comparing unit so as to control the feedback current.

The current control unit may include a switch group including a plurality of switches individually connected to the plurality of parallel paths and receiving the feedback currents, the switch group switching the plurality of switches according to the second switching signal from the decoder unit to switch the paths of the feedback currents, and a current mirror unit mirroring the feedback current of the path that is switched by each of the switches of the switch group.

The current mirror unit may include a ninth transistor group including a plurality of transistors connected in series with each other to mirror the reference current from the comparing unit, and a tenth transistor group including a plurality of transistors connected in parallel with the switches of the switch group, connected in parallel with each other, and each receiving the reference current mirrored by the ninth transistor group.

The digital-analog converter may be integrated into a driving IC for a display device.

The adding unit may add the second voltage selected by the switch unit and the feedback voltage to output a driving voltage.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. However, in description of operation principles associated with the embodiments of the present invention, detailed description of a known art or construction is omitted because it may obscure the spirit of the present invention unnecessarily.

Figure 1A:
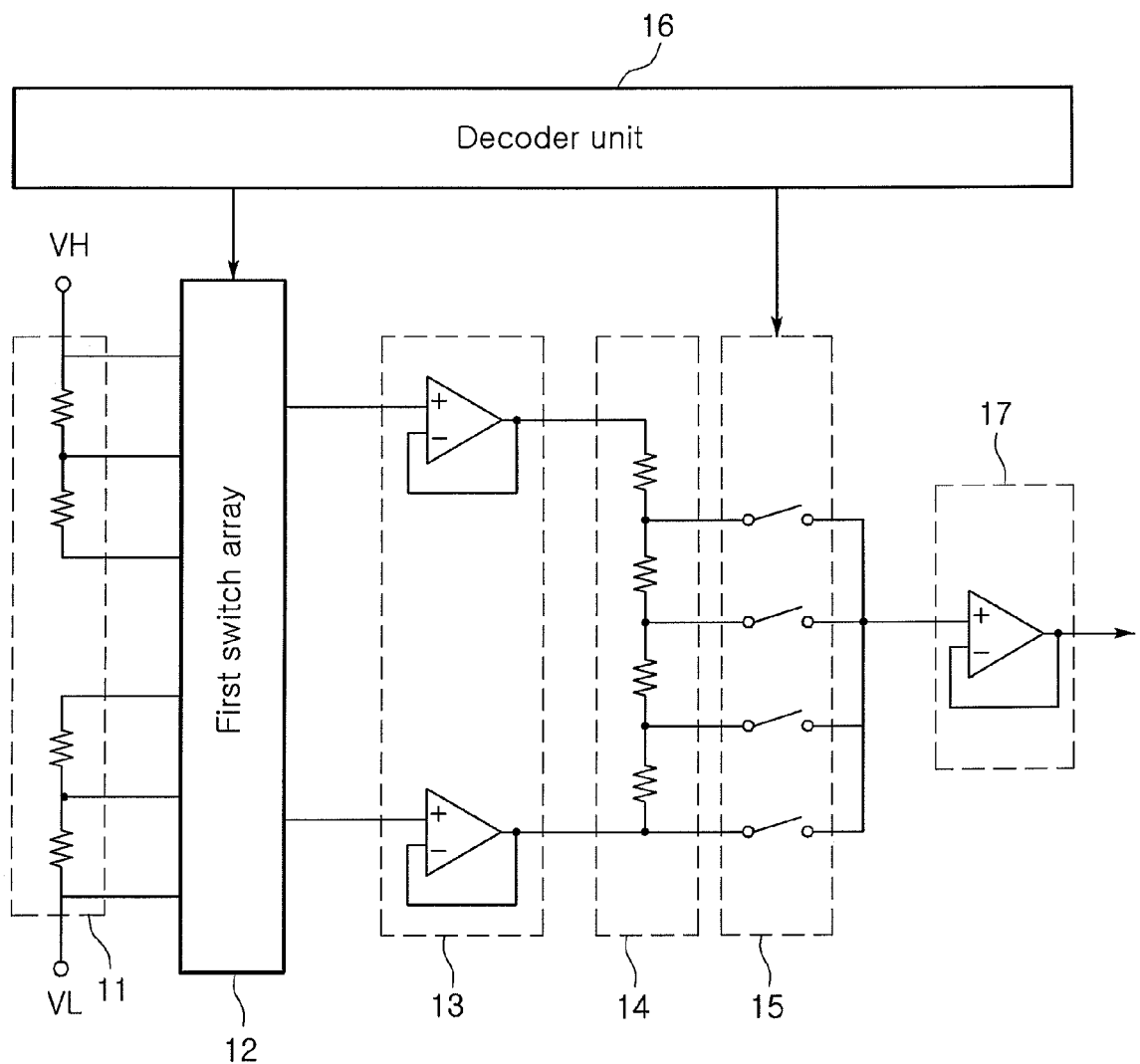
FIGS. 1A and 1B are configuration views illustrating a digital-analog converter according to the related art.
Figure 1B:
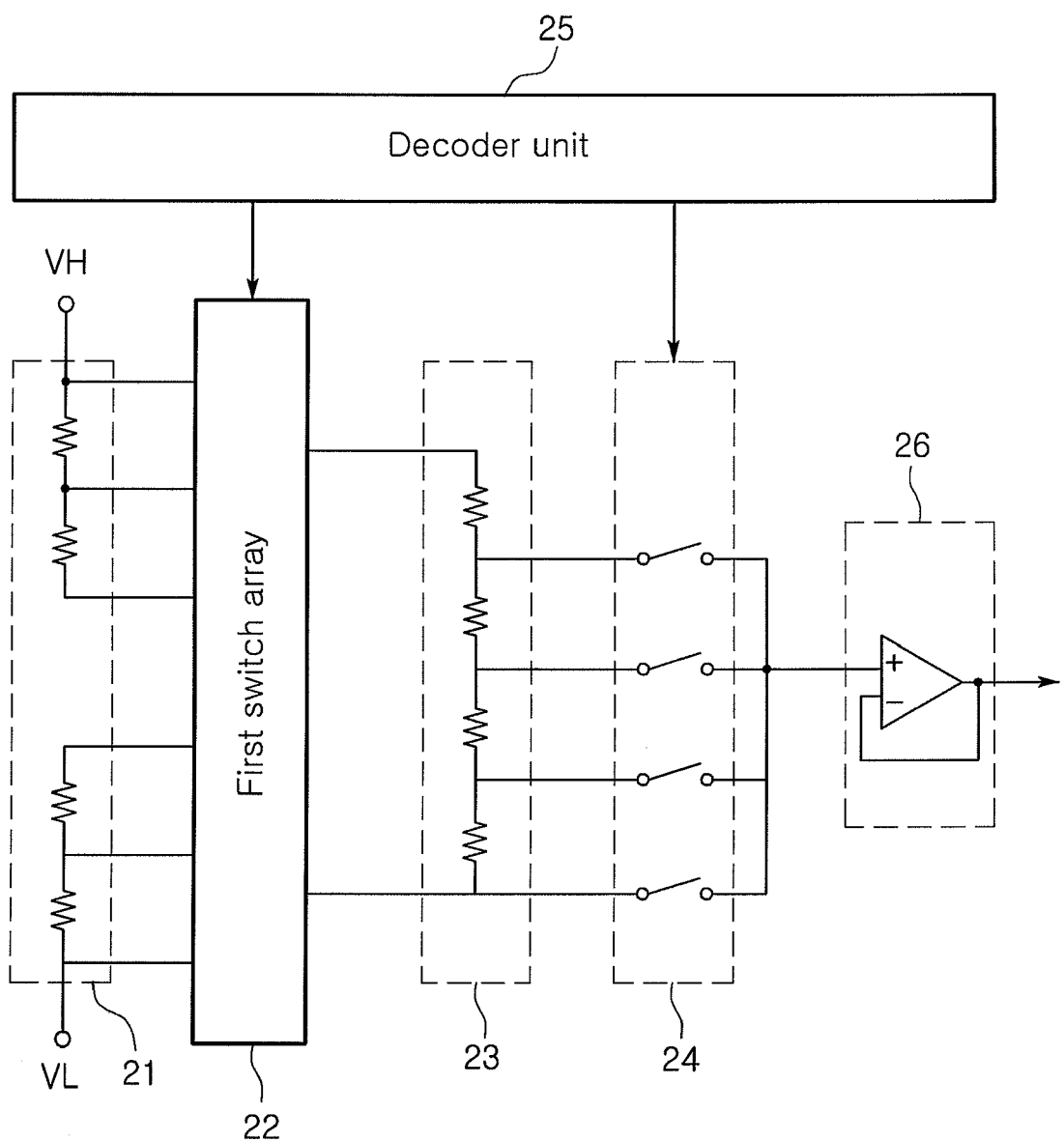
Figure 2:
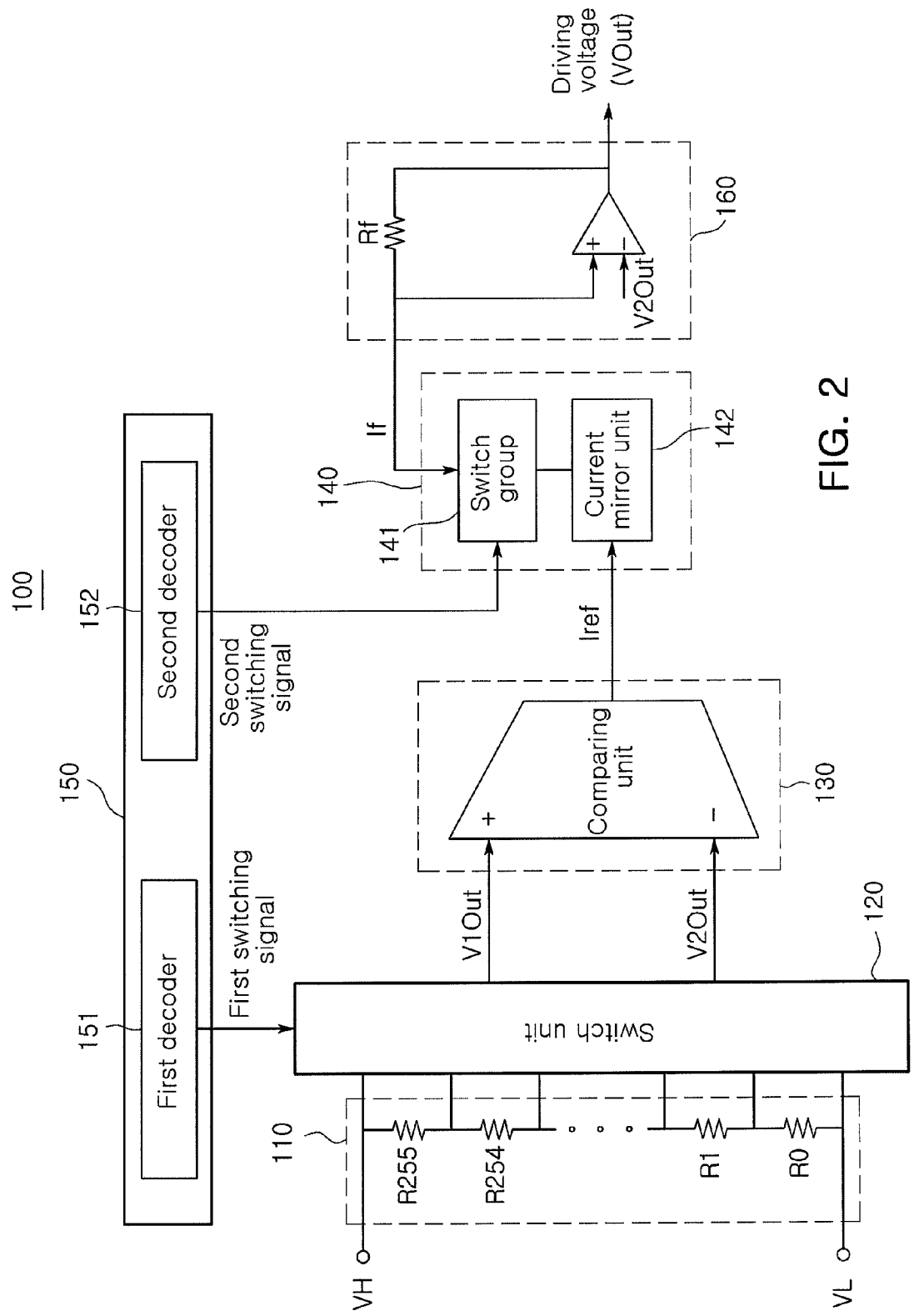
FIG. 2 is a configuration view illustrating a digital-analog converter according to an exemplary embodiment of the present invention.

FIG. 2 is a configuration view illustrating a digital-analog converter according to an exemplary embodiment of the invention.

Referring to FIG. 2, a digital-analog converter 100 according to an exemplary embodiment of the present invention includes a voltage dividing unit 110, a switch unit 120, a comparing unit 130, a current control unit 140, a decoder unit 150, and an adding unit 160.

The voltage dividing unit 110 includes a plurality of resistors R0 to R255 that are connected in series with each other between operating voltage terminals VH and VL. The number of the plurality of resistors R0 to R255 is in proportion to the number of bits of resolution of the digital-analog converter. The voltage dividing unit 110 includes 256 ($2^8$) resistors on the basis of eight bits.

The switch unit 120 includes a plurality of switches that switch voltages divided by the plurality of resistors R0 to R255 included in the voltage dividing unit 110. Though not shown, the plurality of switches that are connected in parallel with on each other, and each of the switches switches each of the voltages divided by the plurality of resistors R0 to R255. Therefore, preferably, the number of the plurality of switches is the same as the number of the plurality of resistors R0 to R255.

The comparing unit 130 receives a first voltage V1out and a second voltage V2out from the switch unit 120, and outputs a reference current Iref that corresponds to a difference between the first voltage V1out and the second voltage V2out. The configuration of the above-described comparing unit 130 will be described in detail with reference to FIG. 3.

The current control unit 140 includes a switch group 141 and a current mirror unit 142. The switch group 141 includes a plurality of switches (not shown) that are connected in parallel with each other. The current mirror unit 142 receives the reference current Iref from the comparing unit 130 and a feedback current that is selected by the switch group 141. The detailed configuration of the above-described current control unit 140 will be described below with reference to FIG. 4.

The decoder unit 150 includes a first decoder 151 and a second decoder 152. The first decoder 151 provides a first switching signal for controlling the operation of selecting the voltages by the switch unit 120. The second decoder 152 provides a second switching signal, by which the current control unit 140 controls the current control of the switch group 141.

Preferably, the adding unit 160 may be composed of an amplifier. More preferably, the adding unit 160 may be composed of an operational amplifier (op amp). The adding unit 160 receives the second voltage V2out through a positive input terminal (+) and an out voltage through a negative input terminal (−). Here, the output voltage of the adding unit 160 is fed back to the adding unit 160 through a feedback resistor Rf.

Figure 3A:
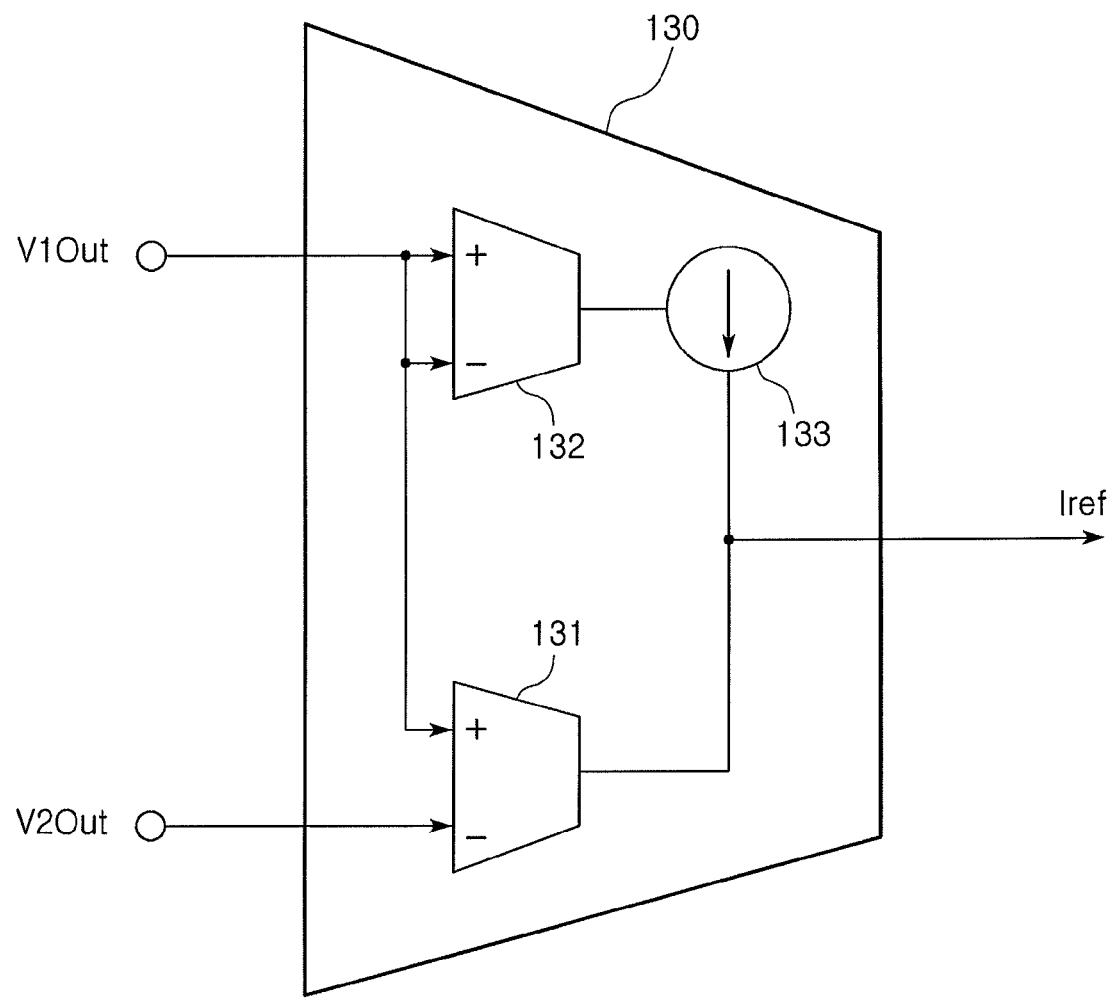
FIGS. 3A and 3B are configuration views illustrating a comparing unit that is used in the digital-analog converter according to the exemplary embodiment of the present invention.
Figure 3B:
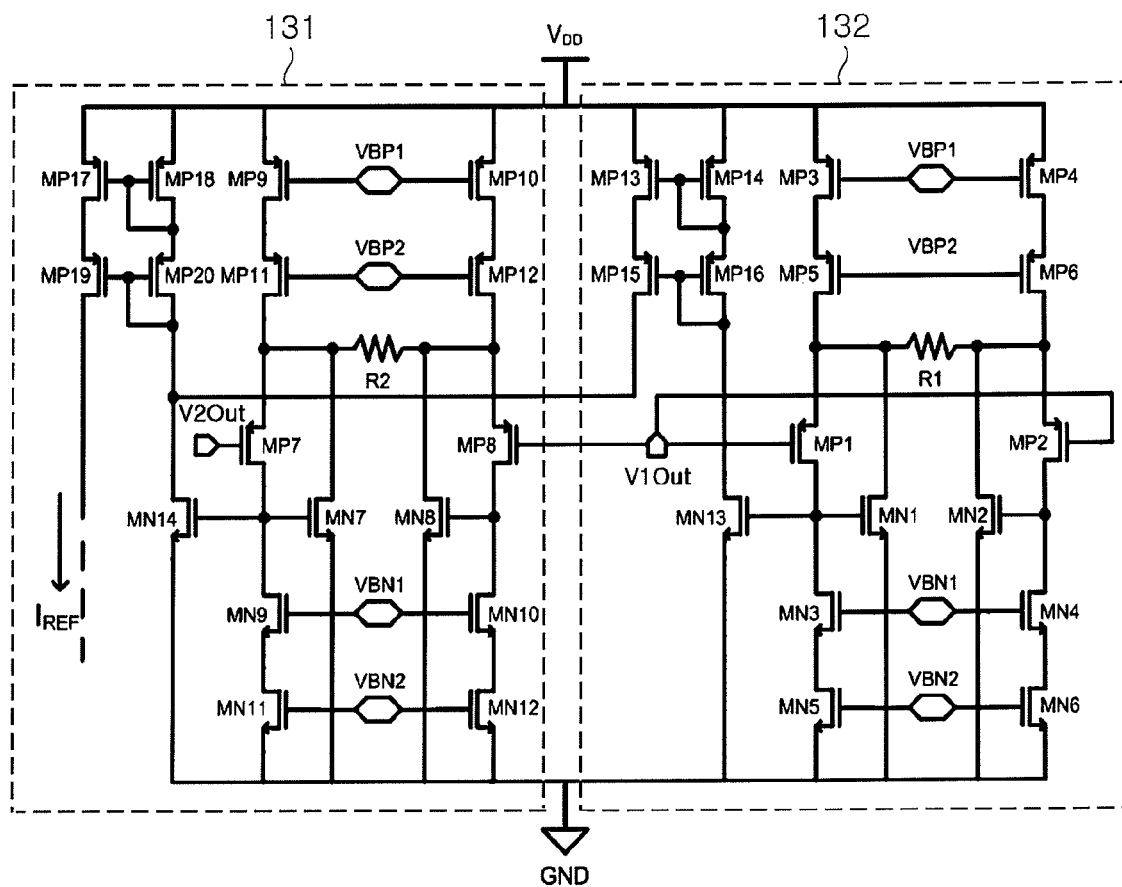

FIGS. 3A and 3B are configuration views illustrating a comparing unit that is used in the digital-analog converter according to the exemplary embodiment of the present invention.

Referring to FIG. 3A, the comparing unit 130 includes a first operational transconductor amplifier (hereinafter, simply referred to as an OTA) 131 and a second OTA 132. The first OTA 131 receives the second voltage V2out through a negative input terminal (−) and the first voltage V1out through a positive input terminal (+). The second OTA 132 receives the first voltage V1out through a positive input terminal (+) and a negative input terminal (−).

Referring to FIG. 3B, each of the first OTA 131 and the second OTA 132 may be composed of a comparator circuit that includes a plurality of transistors. A first comparator circuit that forms the first OTA 131 includes a first transistor group, a second transistor group, a first resistor R1, a third transistor group, and a fourth transistor group. The first transistor group includes a plurality of transistors MP7 and MP8, each of which receives and switches the first voltage V1out and the second voltage V2out. The second transistor group includes a plurality of transistors MP9 to MP12 and MN9 to MN12 that are connected in series with the first transistor group MP7 and MP8 and connected in parallel with each other so as to mirror the current that is switched by the first transistor group MP7 and MP8. The first resistor R1 has a resistance set beforehand and is connected between input terminals of the plurality of transistors of the first transistor group MP7 and MP8. The third transistor group includes a plurality of transistors MN7 and MN8 that are connected to both ends of the first resistor R1, respectively, to mirror the current that is switched by the first transistor group MP7 and MP8. The fourth transistor group includes a plurality of transistors MN14 and MP17 to MP20 that receive the switched current that is mirrored by the third transistor group MN14 and MP17 to MP20. Further, the plurality of transistors MN14 and MP17 to MP20 are connected in parallel with each other to mirror the current mirrored by the third transistor group MN7 and MN8 to generate the reference current.

In the same manner, a second comparator circuit that forms the second OTA 132 includes a fifth transistor group, a sixth transistor group, a second resistor R2, a seventh transistor group, and an eighth transistor group. The fifth transistor group includes a plurality of transistors MP1 and MP2, each of which receives and switches the first voltage from the comparing unit. The sixth transistor group includes a plurality of transistors MP3 to MP6 and MN3 to MN6 that are connected in series with the fifth transistor group MP1 and MP2 and connected in parallel with each other so as to mirror the current that is switched by the fifth transistor group MP1 and MP2. The second resistor R2 has a resistance set beforehand and is connected between input terminals of the plurality of transistors MP1 and MP2 of the fifth transistor group MP1 and MP2. The seventh transistor group includes a plurality of transistors MN1 and MN2 that are connected to both ends of the second resistor R2, respectively, to mirror the current that is switched by the fifth transistor group MP1 and MP2. The eighth transistor group includes a plurality of transistors MN13 and MP13 to MP16 that receive the switched current that is mirrored by the seventh transistor group MN1 and MN2. Further, the plurality of transistors MN13 and MP13 to MP16 are connected in parallel with each other to off-set unnecessary current components that are included in the reference current of the fourth transistor group MN14 and MP17 to MP20.

The above-described reference numerals N and P of the transistor groups refer to an N-type transistor and a P-type transistor, respectively.

Figure 4:
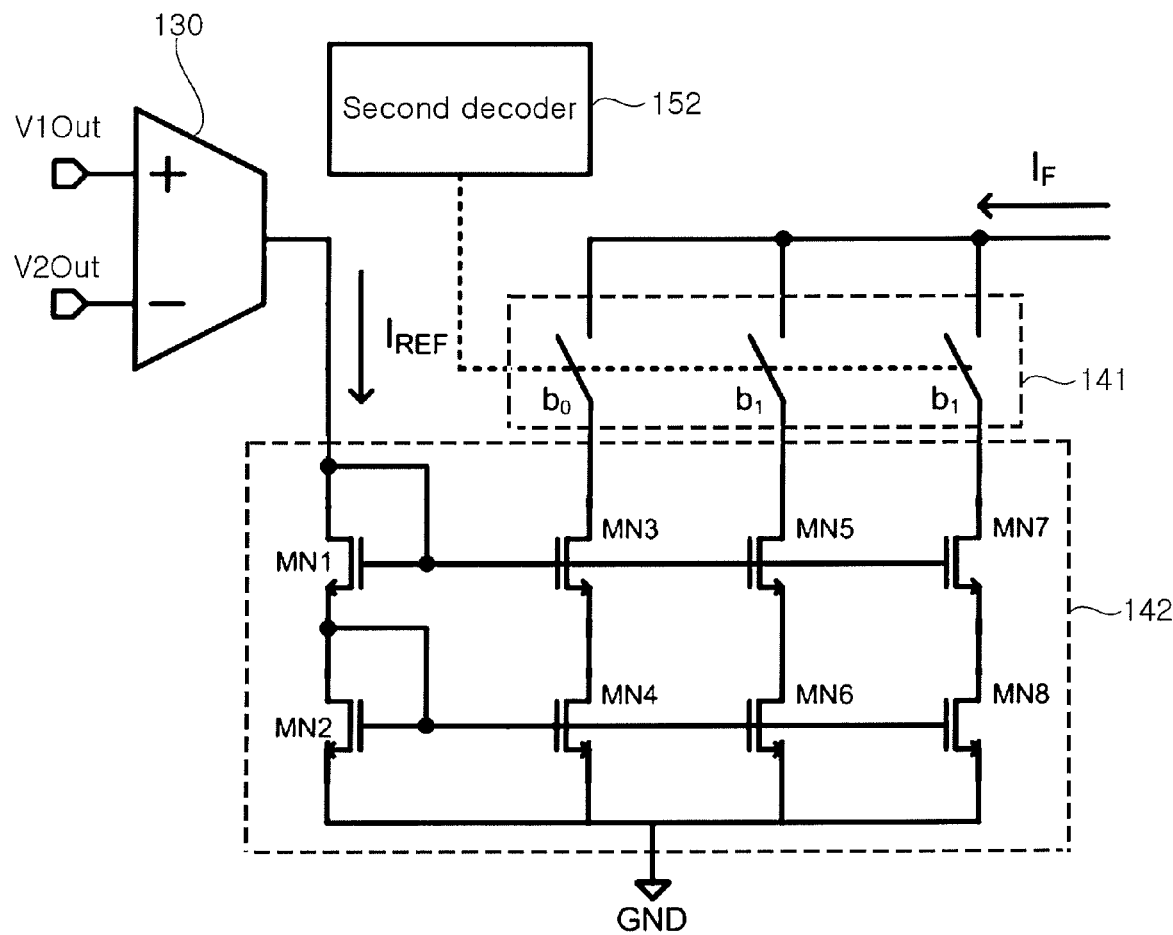
FIG. 4 is a configuration view illustrating a current control unit that is used in the digital-analog converter according to the exemplary embodiment of the present invention.

FIG. 4 is a configuration view illustrating a current control unit that is used in the digital-analog converter according to the exemplary embodiment of the present invention.

Referring to FIG. 4, the current control unit 140 includes the switch group 141 that includes the plurality of switches, and the current mirror unit 142.

The switch group 141 includes a plurality of switches S1 to S3 that are connected in parallel with each other. Each of the switches S1 to S3 receives the feedback current If from the adding unit 160. The number of the plurality of switches increases according to the number of bits for the resolution extension. Preferably, in case of two bits, the switch group 141 may include three switches S1 to S3.

The current mirror unit 142 may be composed of a current mirror circuit that includes a plurality of N-type transistors. That is, the current mirror unit 142 may be composed of a current mirror circuit that includes a first transistor group and a second transistor group. The first transistor group includes a plurality of N-type transistors MN15 and MN16 that receive and mirror the reference current Iref from the comparing unit 130. The second transistor group includes a plurality of N-type transistors MN17 to MN22 that are connected in series with the plurality of switches S1 to S3 of the switch group 141 and receive the reference current that is mirrored by the first transistor group MN15 and MN16.

Preferably, the analog-digital converter according to the exemplary embodiment of the present invention is integrated into a driving IC that drives a display device.

Figure 5:
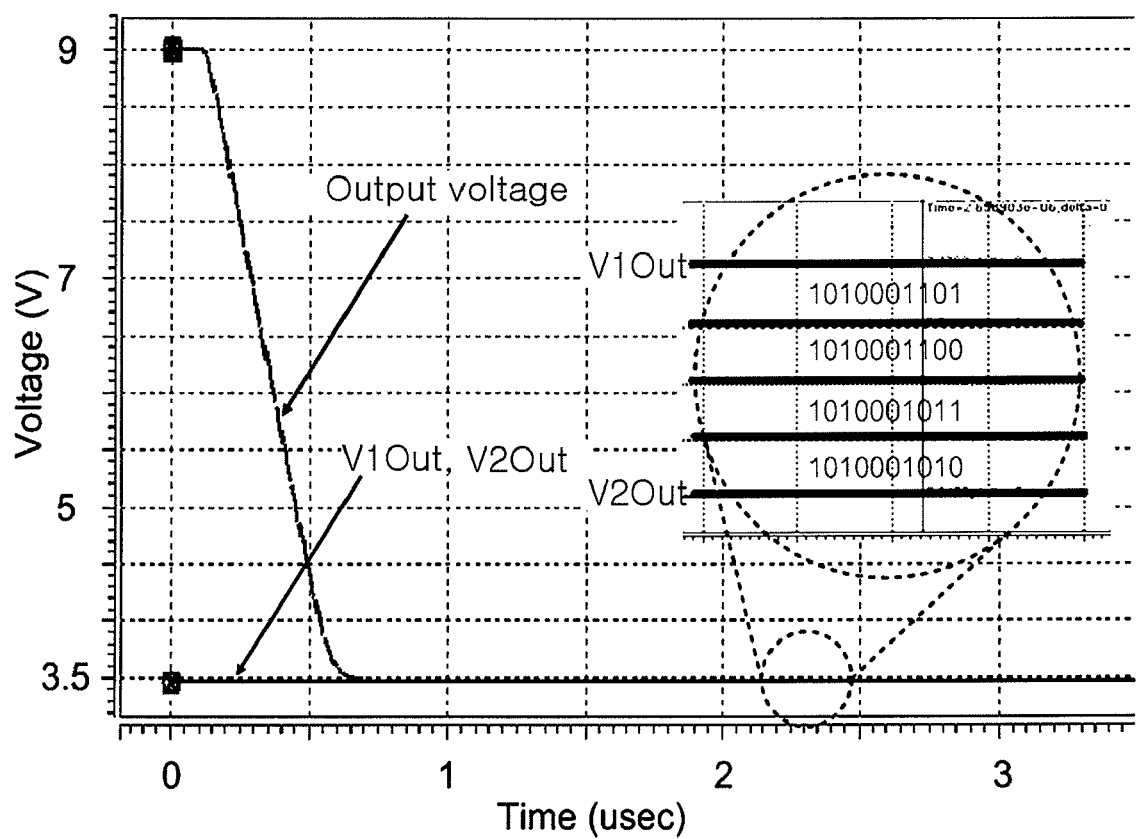
FIG. 5 is a graph illustrating resolution extension of the digital-analog converter according to the exemplary embodiment of the present invention.

FIG. 5 is a graph illustrating resolution extension of the digital-analog converter according to the exemplary embodiment of the present invention.

Referring to FIG. 5, the resolution extension of the digital-analog converter according to the exemplary embodiment of the present invention can be shown.

Hereinafter, the operation and effect of the present invention will be described in detail.

Referring to FIGS. 2 to 4, the voltage dividing unit 110 that is used in the digital-analog converter 100 according to the exemplary embodiment of the present invention receives operating voltages of the operating voltage terminals VH and VL. That is, the plurality of resistors of the voltage dividing unit 110 that are connected in series with each other are connected between the operating voltage terminals to divide the operating voltages. Each of the divided voltages is applied to the switch unit 120. The switch unit 120 includes the plurality of switches that are connected in parallel with each other. Each of the plurality of switches receives each of the divided voltages to select the two voltages V1out and V2out according to the first switching signal of the first decoder 151.

Preferably, the two voltages V1out and V2out are the first voltage V1out and the second voltage V2out that are selected by the adjacent switches to each other. Further, preferably, the first voltage V1out has a higher value than the second voltage V2out.

The above-described operation is a conversion process to obtain 8-bit resolution. In order to obtain the resolution of 10 bits or more, which is larger than the 8-bit resolution, an additional conversion process is required as follows.

Referring to FIG. 3A, the first voltage V1out and the second voltage V2out are input to the positive terminal (+) and the negative terminal (−) of the comparing unit 130, respectively. More particularly, the comparing unit 130 includes the first OTA 131 and the second OTA 132. The first voltage V1out is input to the positive terminal (+) of the first OTA 131, and the second voltage V2out is input to the negative terminal (−) of the first OTA 131. Further, the first voltage V1out is input to each of the positive terminal (+) and the negative terminal (−) of the second OTA 132. The comparing unit 130 compares the first voltage V1out with the second voltage V2out and outputs the reference current Iref that corresponds to a difference between the first voltage V1out and the second voltage V2out.

Referring to FIG. 3B, the first OTA 131 and the second OTA 132 include the first and second resistors R1 and R2, respectively, which have resistances set beforehand. The comparing unit 130 outputs the reference current Iref corresponding to the difference between the first voltage V1out and the second voltage V2out according to the resistances.

That is, the reference current Iref can be represented by the following equation.

$$Iref = (V1out - V2out) \times Gm$$

(here, Gm refers to the reciprocal of the resistance.)

The above-described reference current Iref is transmitted to the current control unit 140.

Referring to FIG. 4, the switch group 141 of the current control unit 140 includes the switches S1, S2, and S3 that are connected in parallel with each other.

The second decoder 152 outputs the second switching signal to the switch group 141. According to the second switching signal, each of the first to third switches S1, S2, and S3 of the switch group 141 performs an on and off operation.

Here, the second decoder 152 may be a 2-bit decoder, and thus the second switching signal may be a 2-bit switching signal. That is, the second switching signal may be divided into a first bit switching signal b1 having one bit of 0 or 1 and a second bit switching signal b2 having the other bit of 0 or 1. The first bit switching signal b1 controls the on and off operation of the first switch S1, and the second bit switching signal b2 controls the on and off operation of the second and third switches S2 and S3 at the same time.

Meanwhile, the adding unit 160 transmits the feedback current If to the switch group 141. According to the paths of the feedback current If, the feedback current If is transmitted to the switch group 141 through the feedback resistor Rf.

The above-described feedback current If is obtained by the following equation.

$$if = \frac{(V1out - V2out)}{4Rf}$$

The paths of the feedback current If are respectively input to the first to third switches S1, S2, and S3 of the switch group 141, and selected according to the first bit switching signal b1 and the second bit switching signal b2.

The feedback current if is in proportion to the reference current Iref according to the plurality of transistors of the current mirror unit 142 that are connected in parallel with each other.

The relationship between the reference current Iref and the feedback current If that is selected on the basis of the first bit switching signal b1 and the second bit switching signal b2 is shown in Table as follows.

TABLE

| b1  | b2  | If    |
|-----|-----|-------|
| on  | on  | 3Iref |
| off | on  | 2Iref |
| on  | off | Iref  |
| off | off | x     |

That is, the current mirror unit 142 mirrors the current having the same value as the reference current Iref. When the first switch S1 is selected and the second and third switches S2 and S3 are not selected, the feedback current If that is equal to the reference current Iref is mirrored according to the plurality of transistors. When the first switch S1 is not selected and the second and third switches S2 and S3 are selected, the feedback current If that is twice as large as the reference current Iref is mirrored according to the plurality of transistors.

The adding unit 160 adds a feedback voltage corresponding to the above-described feedback current If and the second voltage V2out to output an output voltage Vout. The output voltage Vout can be obtained by the following equation.

$$Vout = V2out + (b1 \circ Iref) + (2b1 \circ Iref)$$

In this way, the voltage between the first voltage V1out and the second voltage V2out that are adjacent to each other is divided to extend the resolution.

Referring to FIG. 5, it can be seen that the resolution is extended by dividing the voltage between the first voltage V1out and the second voltage V2out.

Here, the voltage between the first voltage V1out and the second voltage V2out is divided into four voltages by using the second decoder 152, which is the 2-bit decoder, the switch group 141 having the three switches S1, S2, and S3, and the current mirror unit 142 having the plurality of switches. However, when the number of bits of the second decoder 152, the number of switches of the switch group 141, and the number of transistors of the current mirror unit 142 are increased, the voltage between the first voltage V1out and the second voltage V2out can be divided to four or more voltages to thereby easily extend the resolution. Further, the divided voltages except for four voltages may be used as correction voltages, thereby obtaining accurate resolution.

As set forth above, according to exemplary embodiments of the invention, in the resolution extension of the digital-analog converter that is used in the driving IC of the display, an increase in chip area can be prevented, the configuration of the circuit required for the resolution extension can be simplified, and correction of the resolution is performed to provided accurate resolution.

While the present invention has been shown and described in connection with the exemplary embodiments, it will be apparent to those skilled in the art that modifications and variations can be made without departing from the spirit and scope of the invention as defined by the appended claims.

What is claimed is:

1. A digital-analog converter capable of easily extending the resolution, the digital-analog converter comprising:

a voltage dividing unit including a plurality of resistors connected in series with each other between operating voltage terminals to divide operating voltages into a plurality of voltages at connection nodes of the plurality of resistors;

a decoder unit providing a plurality of switching signals including a first switching signal for selecting a voltage and a second switching signal for controlling the current;

a switch unit selecting two voltages from the plurality of voltages divided by the voltage dividing unit according to the first switching signal;

a comparing unit comparing the two voltages with each other selected by the switching unit to output a reference current corresponding to a difference between the two voltages;

a current control unit controlling a feedback current according to the second switching signal of the decoder unit; and an adding unit transmitting the feedback current to the current control unit and adding one voltage between the two voltages selected by the switch unit and a feedback voltage determined according to the feedback current.

2. The digital-analog converter of claim 1, wherein the switch unit selects two voltages of the connection nodes adjacent to each other from the plurality of voltages divided by the voltage dividing unit.

3. The digital-analog converter of claim 2, wherein the decoder unit comprises:

a first decoder decoding an external voltage selecting signal to provide the first switching signal; and a second decoder decoding an external current control signal to provide the second switching signal.

4. The digital-analog converter of claim 1, wherein the comparing unit comprises:

a first comparator circuit receiving a first voltage having a higher voltage than the other voltage between the two voltages, and a second voltage having a lower value than the first voltage to output the reference current corresponding to the difference between the first voltage and the second voltage according to a resistance set beforehand; and a second comparator circuit receiving the first voltage to off-set unnecessary current occurring in the first comparator circuit according to a resistance set beforehand.

5. The digital-analog converter of claim 4, wherein the first comparator circuit comprises:

a first transistor group including a plurality of transistors each receiving and switching the first voltage and the second voltage from the comparing unit;

a second transistor group including a plurality of transistors connected in series with the first transistor group and connected in parallel with each other to mirror the current switched by the first transistor group;

a first resistor having a resistance set beforehand and connected between input terminals of the plurality of transistors of the first transistor group;

a third transistor group including a plurality of transistors connected to both ends of the first resistor, respectively, to mirror the current switched by the first transistor group; and a fourth transistor group including a plurality of transistors receiving the switched current mirrored by the third transistor group, the transistors connected in parallel with each other and mirroring the current mirrored by the third transistor group to generate the reference current, and the second comparator circuit comprises:

a fifth transistor group including a plurality of transistors each receiving and switching the first voltage from the comparing unit;

a sixth transistor group including a plurality of transistors connected in series with the fifth transistor group, connected in parallel with each other, and mirroring the current switched by the fifth transistor group;

a second resistor having a resistance value set beforehand and connected between input terminals of the plurality of transistors of the fifth transistor group;

a seventh transistor group including a plurality of transistors connected to both ends of the second resistor, respectively, to mirror the switched current mirrored by the fifth transistor group; and an eight transistor group including a plurality of transistors receiving the switched current mirrored by the seventh transistor group, the transistors connected in parallel with each other and mirroring the current mirrored by the seventh transistor group to off-set necessary current components included in the reference current of the fourth transistor group.

6. The digital-analog converter of claim 4, wherein the adding unit adds the second voltage selected by the switch unit and the feedback voltage to output a driving voltage.

7. The digital-analog converter of claim 1, wherein the current control unit switches parallel paths of the feedback current according to the second switching signal, and mirrors a feedback current of the selected path using the reference current from the comparing unit so as to control the feedback current.

8. The digital-analog of claim 7, wherein the current control unit comprises:

a switch group including a plurality of switches individually connected to the plurality of parallel paths and receiving the feedback currents, the switch group switching the plurality of switches according to the second switching signal from the decoder unit to switch the paths of the feedback currents; and a current mirror unit mirroring the feedback current of the path that is switched by each of the switches of the switch group.

9. The digital-analog converter of claim 8, wherein the current mirror unit comprises:

a ninth transistor group including a plurality of transistors connected in series with each other to mirror the reference current from the comparing unit; and a tenth transistor group including a plurality of transistors connected in parallel with the switches of the switch group, connected in parallel with each other, and each receiving the reference current mirrored by the ninth transistor group.

10. The digital-analog converter of claim 1, wherein the digital-analog converter is integrated into a driving IC for a display device.

* * * * *